US006900682B2

(12) United States Patent
Truong et al.

(10) Patent No.: US 6,900,682 B2
(45) Date of Patent: May 31, 2005

(54) CLOCK GENERATOR WITH PROGRAMMABLE NON-OVERLAPPING-CLOCK-EDGE CAPABILITY

(75) Inventors: Ho Dai Truong, San Jose, CA (US); Chong Ming Lin, Sunnyvale, CA (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/669,659

(22) Filed: Sep. 25, 2003

(65) Prior Publication Data

US 2004/0056699 A1 Mar. 25, 2004

Related U.S. Application Data

(63) Continuation of application No. 10/277,757, filed on Oct. 23, 2002, now Pat. No. 6,653,881, which is a continuation of application No. 09/970,773, filed on Oct. 5, 2001, now Pat. No. 6,489,826, which is a continuation of application No. 09/726,035, filed on Dec. 1, 2000, now Pat. No. 6,323,711, which is a continuation of application No. 09/376,186, filed on Aug. 17, 1999, now Pat. No. 6,163,194, which is a continuation of application No. 08/795,363, filed on Feb. 4, 1997, now Pat. No. 5,966,037, which is a continuation of application No. 08/478,534, filed on Jun. 7, 1995, now abandoned, which is a division of application No. 08/255,910, filed on Jun. 8, 1994, now Pat. No. 5,444,405, which is a continuation of application No. 07/967,614, filed on Oct. 28, 1992, now abandoned, which is a continuation-in-part of application No. 07/844,066, filed on Mar. 2, 1992, now abandoned.

(51) Int. Cl.[7] .......................... H03H 11/16; H03K 5/13
(52) U.S. Cl. .................................. 327/259; 327/239
(58) Field of Search ............................. 327/237, 239, 327/257, 258, 259, 250–255

(56) References Cited

U.S. PATENT DOCUMENTS 3,622,809 A    11/1971  Williams ................... 327/271
3,953,744 A    4/1976   Kawagoe ................... 327/144
4,369,381 A    1/1983   Okamoto et al. ........... 327/206

(Continued)

FOREIGN PATENT DOCUMENTS

| JP | 64-68016     | 3/1989  |
| JP | H02-124627 A | 5/1990  |
| JP | 2-124627     | 5/1990  |
| JP | 2-199918     | 8/1990  |
| JP | 3-102911     | 4/1991  |
| JP | 3-175720     | 7/1991  |
| JP | 4-104511     | 4/1992  |
| JP | 4-207216     | 7/1992  |
| JP | 4-216213     | 8/1992  |
| JP | 63-253715    | 10/1998 |

OTHER PUBLICATIONS

English Language Translation of Japanese Patent JP–64–68016, pp. 1–12.

*Primary Examiner*—Tuan T. Lam
(74) *Attorney, Agent, or Firm*—Sterne Kessler Goldstein & Fox PLLC

(57) ABSTRACT

A system and method for generating and optimizing clock signals with non-overlapping edges on a chip using a unique programmable on-chip clock generator. Overlapping of the edges of the clocking signals is avoided by adjusting an amount of delay introduced in the on-chip clock generator circuit. The amount of delay is adjusted by programming the on-chip clock generator using either hardware and/or software programming. In hardware programming, the amount of delay adjusted by physically altering the composition of delay elements in the on-chip clock generator. In software programming, the delay is adjusted using software commands to control the operation of delay elements in the on-chip clock generator, or to select the paths that delay the signals.

10 Claims, 7 Drawing Sheets

U.S. PATENT DOCUMENTS

| | | | |
|---|---|---|---|
| 4,417,158 A | 11/1983 | Ito et al. | 327/295 |
| 4,623,805 A | 11/1986 | Flora et al. | 327/152 |
| 4,677,499 A | 6/1987 | Shirota et al. | 325/89 |
| 4,827,488 A | 5/1989 | Shibano | 375/328 |
| 4,845,390 A | 7/1989 | Chan | 327/278 |
| 4,894,791 A | 1/1990 | Jiang et al. | 327/393 |
| 4,905,192 A | 2/1990 | Nogami et al. | 327/535 |
| 4,929,854 A | 5/1990 | Iino et al. | 327/297 |
| 5,041,738 A | 8/1991 | Walters, Jr. | 327/130 |
| 5,047,659 A | 9/1991 | Ullrich | 327/259 |
| 5,120,990 A * | 6/1992 | Koker | 327/2 |
| 5,128,554 A | 7/1992 | Hoshizaki | 327/147 |
| 5,155,379 A | 10/1992 | Narahara | 327/292 |
| 5,345,110 A | 9/1994 | Renfro et al. | 327/525 |
| RE34,808 E | 12/1994 | Hsieh | 326/71 |
| 5,444,405 A | 8/1995 | Truong et al. | 327/239 |
| 5,479,132 A | 12/1995 | Verhaeghe et al. | 327/553 |
| 5,831,459 A | 11/1998 | McDonald | 327/141 |
| 5,966,037 A | 10/1999 | Truong et al. | 327/239 |
| 5,977,809 A | 11/1999 | Wang et al. | 327/239 |
| 6,163,194 A | 12/2000 | Truong et al. | 327/259 |
| 6,323,711 B2 | 11/2001 | Truong et al. | 327/259 |
| 6,489,826 B2 | 12/2002 | Truong et al. | 327/259 |

* cited by examiner

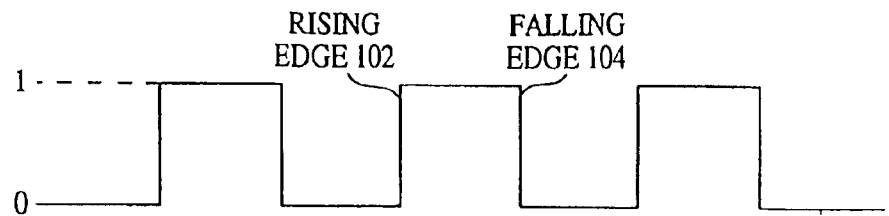
FIG. 1
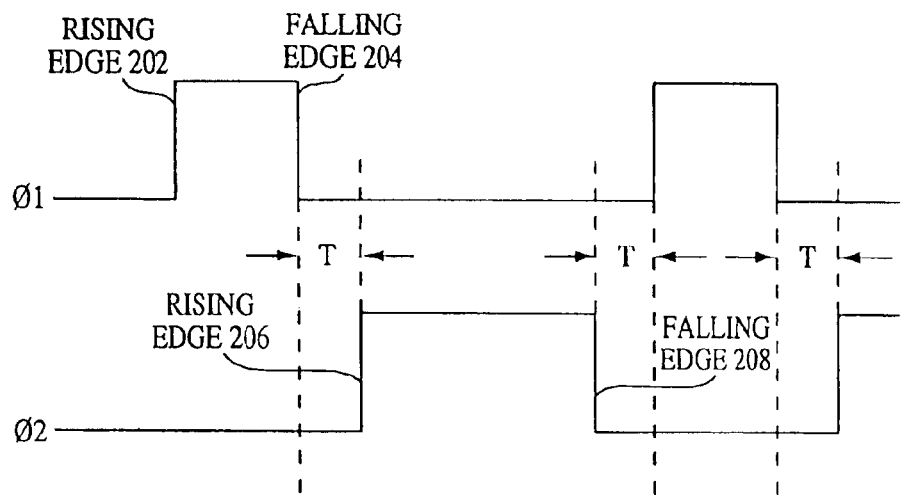
FIG. 2A
FIG. 2B

CLOCK GENERATOR WITH PROGRAMMABLE NON-OVERLAPPING-CLOCK-EDGE CAPABILITY

CROSS-REFERENCE TO RELATED APPLICATIONS

This is a continuation of application Ser. No. 10/277,757, filed Oct. 23, 2002, now U.S. Pat. No. 6,653,881 which is a continuation of application Ser. No. 09/970,773, filed Oct. 5, 2001, now U.S. Pat. No. 6,489,826, which is a continuation of application Ser. No. 09/726,035 filed Dec. 1, 2000, now U.S. Pat. No. 6,323,711, which is a continuation of application Ser. No. 09/376,186, filed Aug. 17, 1999, now U.S. Pat. No. 6,163,194, which is a continuation of application Ser. No. 08/795,363, filed Feb. 4, 1997, now U.S. Pat. No. 5,966,037, which is a continuation of application Ser. No. 08/478,534, filed Jun. 7, 1995, now abandoned, which is a division of application Ser. No. 08/255,910, filed Jun. 8, 1994, U.S. Pat. No. 5,444,405, which is a continuation of application Ser. No. 07/967,614, filed Oct. 28, 1992, now abandoned, which is a continuation-in-part of application Ser. No. 07/844,066, filed Mar. 2, 1992, now abandoned.

BACKGROUND OF THE INVENTION

1. Field of the Invention

The present invention relates generally to a programmable clock generator for integrated circuits, very large scale integrated circuits (VLSI), and ultra large scale integrated circuits (ULSI). More particularly, the present invention relates to a programmable clock generator for selecting optimal non-overlapping clocking signals for controlling elements on a chip.

2. Related Art

Most microprocessor chips operate as control driven, synchronous sequential systems. This means the sequence of operations in the system is synchronized by a master clock signal (usually an external clock). This clock signal is usually one of the forms shown in FIG. 1; which illustrates a square wave with a 50% duty cycle.

The master clock signal allows system operations to occur at regularly spaced-intervals. In particular, operations on the chip are made to take place at times when the clock signal is making a transition from low-to-high or from high-to-low; rising edge 102 or falling edge 104, respectively.

Many microprocessor chips have their timing controlled by two or more related clock signals generated by an on-chip clock generator based on the master clock signal. FIG. 2A illustrates one such combination utilizing two clock signals identified by $\phi 1$ and $\phi 2$. This clocking arrangement provides four different edges and three different states per period, compared to only two edges and two states per period provided with a single clock signal as shown in FIG. 1. FIG. 2B illustrates examples of the three possible states for clock signals $\phi 1$ and $\phi 2$. For elements on the chip to function properly, it is important that edges of clock signals $\phi 1$ and $\phi 2$ are non-overlapping. If the edges overlap there will be more restrictions on data transfer and signal hand shaking.

Additionally, it is equally important that non-overlapping clock edges be evenly distributed to all corners of a chip regardless of the distance which those signals must travel. As chip size increases, clock signals $\phi 1$ and $\phi 2$ have to travel greater distances throughout the chip. This causes clock signals $\phi 1$ and $\phi 2$ to become degraded. As distances increase, rising edges 202, 206 and failing edges 204, 208 may become obscured (experience phase shifts and increases in transition times) and can overlap. This phenomenon, sometimes referred to as clock skew, is caused by a number of factors, including: loading, unwanted noise, coupling, capacitance, resistance, inductance and other debilitating effects.

To account for these factors, designers must separate the rising and falling edges 202, 204, 206, 208 of different clock signals (i.e., $\phi 1$ and $\phi 2$) with a large enough margin of time to allow for clock skew. For instance, failing edge 204 and rising edge 206 must be separated by a minimum temporal distance or amount of time (T) to avoid overlapping states; especially for level-triggering operations in metal-oxide-silicon (MOS) technology. The larger T is, the less likely the chip will fail due to overlapping signals caused by skewing. The wide range of operating environments to which the chip(s) may be subject must be considered in selecting T. Therefore, to provide an adequate margin, manufacturers are forced to select T large enough to provide functionality in a worst-case environment. However, a large T is a significant cycle time constraint. Therefore chip design is not optimized for each environment.

To illustrate this, consider current chip design practices that must account for clock skew by designing a chip with a minimum safety distance T between signals against worst-case conditions. Once T is selected the chip is manufactured and tested. If the chip designer selected a clock speed that has insufficient non-overlapping time, the chip will not function due to overlapping states for some circuits located on the chip. When a chip runs properly, chip designers assume they have chosen the correct frequency, clock states; rise and fall times, and non-overlapping time T. However, chip designers do not know whether a faster clock speed or a smaller T are possible. To find out, chip manufacturers must build entirely new chips with different process parameters, which is inefficient and expensive.

Presently, no programming or tweaking can be performed after a chip is finalized. It is possible to have an on-chip clock generator running at different clock frequencies than external crystal oscillators, but the non-overlapping time of the clock edges generated by the clock generator is fixed by circuit hardware. Therefore, what is needed is a flexible system and method of programming an on-chip clock generator at the manufacturing stage to achieve adjustable as well as optimal non-overlapping times T between clock edges.

At the post-manufacturing stage, environmental conditions, such as heat and cold can also affect clock skewing. If a chip is manufactured under laboratory conditions, it may function properly. However, temperature changes may cause the chip to malfunction due to skewed clock signals. Therefore, what is needed is an on-chip clock generator that can be dynamically programmed to select non-overlapping times T to account for environmental fluctuations while the chip is in an operational environment, such as a processor chip operating in a computer.

SUMMARY OF THE INVENTION

The present invention is directed to a system and method for providing programmable non-overlapping clock generation on a chip. The present invention includes four main embodiments. The first embodiment is directed to the overall operation of an on-chip clock generator. The second embodiment is directed to a hardware programmable clock generation system and method. The third embodiment is directed to a software programmable clock generation system and method. The fourth embodiment is directed to a combination of all three embodiments.

The programmable on-chip clock generator provides two phases of a system clock with non-overlapping edges. The programmability of the clock generator provides flexibility during chip fabrication, and when a chip is functioning in a operational environment.

During the manufacturing phases of chip production, characteristics of the on-chip clock generator are altered to ensure the edges of the two generated clocks do not overlap. This allows the manufacturer to optimize the performance of the chip while the chip is undergoing initial production testing. This feature obviates the need to perform costly and time consuming trial-and-error design and redesign of on-chip clock generators.

Additionally, the present invention provides a technique for optimizing the performance of the on-chip clock generator after the chips have left the manufacturing environment. One feature of the present invention is the ability to adjust clock generation dynamically to account for climatic changes in an operational, or other post-production, environment. This allows chips to be manufactured with wider tolerances and allows operation of the chip to be optimized when the chip is in the operational environment.

Adjustments to the on-chip clock generator during the manufacturing phase are referred to as hardware programming because the manufacturer alters the physical composition of the clock generator. Adjustments to the on-chip clock generator once the chip is fabricated and in the operational environment are referred to as software programming. This terminology reflects the fact that through the use of software commands, the characteristics of the on-chip clock generator can be adjusted to compensate for changes in the operating environment. Programming capability in both cases is accomplished by adding or subtracting delay elements in feedback paths within the clock generator circuit.

Further features and advantages of the present invention, as well as the structure and operation of various embodiments of the present invention, are described in detail below with reference to the accompanying drawings.

BRIEF DESCRIPTION OF THE DRAWINGS

FIG. 1 illustrates a square wave with a 50% duty cycle.

FIG. 2A illustrates two clock signals identified by $\phi 1$ and $\phi 2$ with nonoverlapping edges.

FIG. 2B illustrates three possible states for clock signals $\phi 1$ and $\phi 2$.

Figure 3:
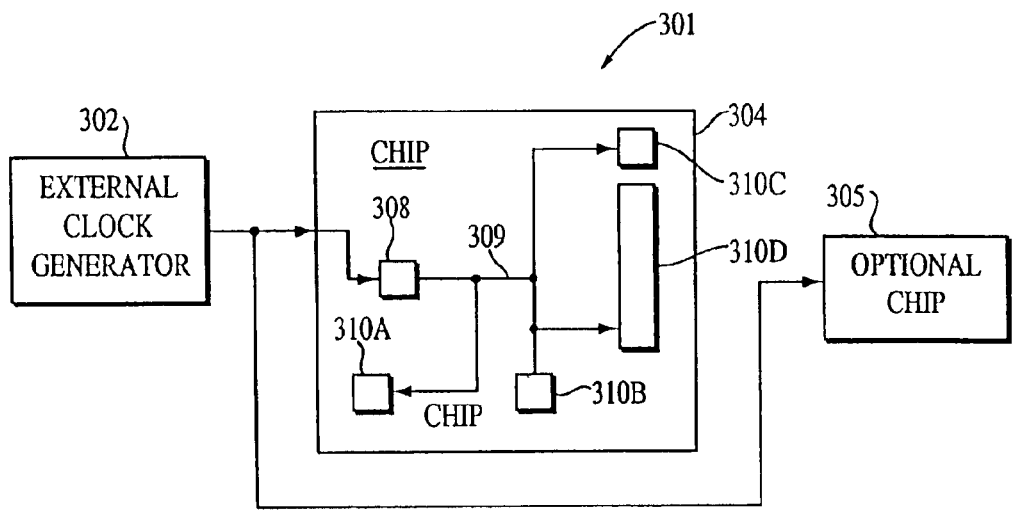
FIG. 3 illustrates a high-level block diagram of an environment in which the present invention operates.

In the drawings the left-most digit of a reference number identifies the drawing in which the reference number first appears.

DETAILED DESCRIPTION OF THE INVENTION

I. General Overview

A. Brief Overview

The present invention is directed to a system and method for providing non-overlapped clock generation on a chip. The present invention includes four main embodiments. The first embodiment is directed to the overall operation of an on chip clock generator. The second embodiment is directed to a hardware programmable clock generation system and method. The third embodiment is directed to a software programmable clock generation system and method. The fourth embodiment is directed to a combination of the first three embodiments.

These embodiments of the present invention are discussed in the following sections.

B. Environment

FIG. 3 illustrates a high level block diagram of an environment 301 in which the present invention operates. Environment 301 may be a wafer containing hundreds of chips at a fabrication/testing stage or a computer in a user environment. As illustrated, environment 301 includes an external clock generator 302 and a chip 304. In a preferred embodiment, external clock generator 302 is a crystal oscillator, which produces a signal similar to that shown in FIG. 1.

Chip 304 has circuit elements 310. Many computers require more than one processor chip. As shown in FIG. 3, an optional co-processor or peripheral chip 305 may be coupled to chip 304.

Chip 304 also has an internal clock generator 308, which provides multiple clock signals to elements 310. In a preferred embodiment clock generator 308 provides two clock signals, $\phi 1$ and $\phi 2$; similar to FIG. 2A. To ensure that active portions of clock signals $\phi 1$ and $\phi 2$ are non-overlapping, clock generator 308 is programmed to achieve optimal non-overlapping clock generation. Accordingly, clock generator 308 provides a plurality of programmable non-overlapping times between clock signals $\phi 1$ and $\phi 2$. In the preferred embodiment, clock generator 308 provides the option of selecting between 0.5 ns, 2.5 ns and 4.5 ns of non-overlapping time between clock signals $\phi 1$ and $\phi 2$ shown as T in FIG. 2A. In alternative embodiments, T must be less than the period of CLKIN 401. Furthermore, for a 50% duty cycle T should be less than the period of CLKIN/2. If this condition is not met, the circuit may chop out clocks.

This flexibility permits adjustments to clock generation if there is not enough holding time between clock edges by increasing T between clock signals $\phi 1$ and $\phi 2$. On the other hand, if there is too much holding time between clock signals $\phi 1$ and $\phi 2$, T can be decreased. In either case, "tweaking" can be performed while the chip is being tested (during the manufacture stage) without expensive and costly changes to the clock design.

Adjustments to clock generator 308 can also be performed in an operational environment (product usage stage). As a result, clock generator 308 can be adjusted for climatic changes which can affect whether clock signals $\phi 1$ and $\phi 2$ are non-overlapping.

II. Clock Generator

Figure 4:
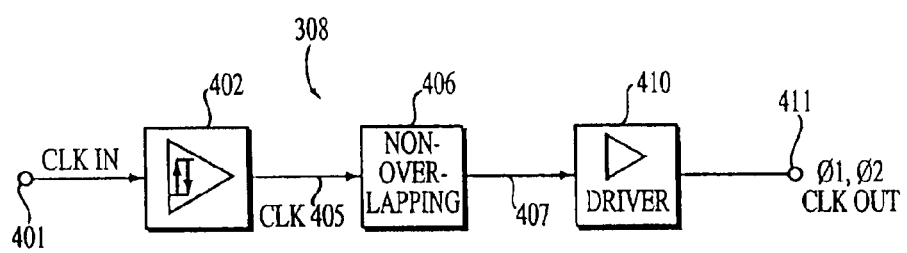
FIG. 4 illustrates a high-level block diagram of clock generator according to the present invention.

FIG. 4 illustrates a high level block diagram of clock generator 308. Clock generator 308 includes an input waveform stabilizer 402, a clock-to-clock non-overlapping time adjuster 406, and a clock driver 410 having a two phase output $\phi 1$ and $\phi 2$ (CLK OUT 411).

Figure 5:
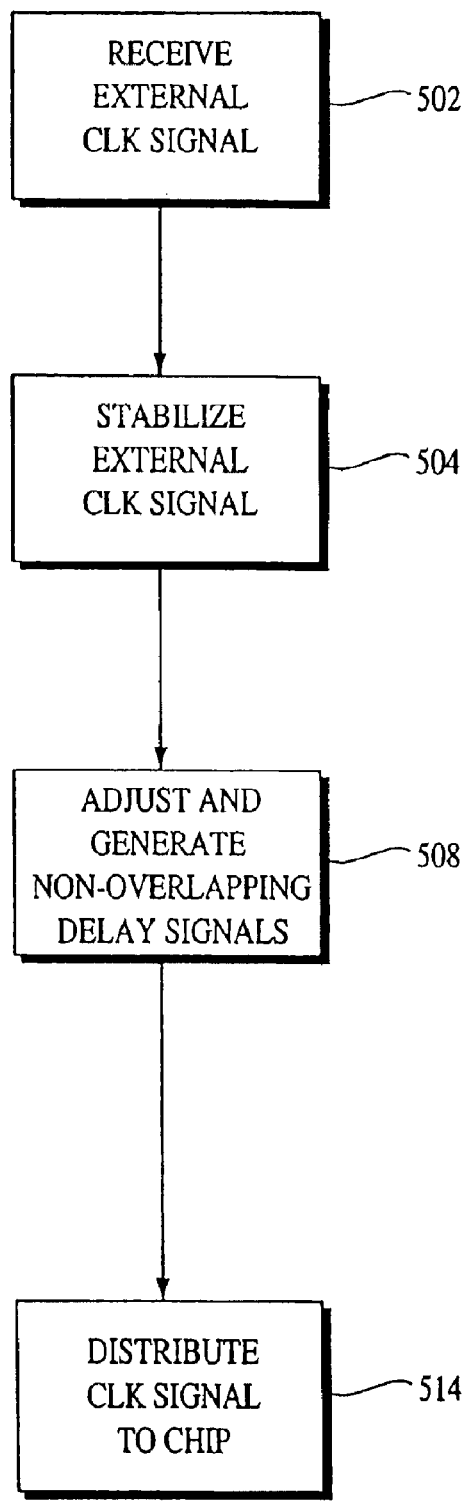
FIG. 5 is a flow chart illustrating the operation of a clock generator according to the present invention.

Operation of clock generator 308 is generally illustrated in the flow chart shown in FIG. 5. In describing the operation of clock generator 308 reference will be made to FIGS. 2–8.

Referring now to FIGS. 4 and 5, in a step 502, clock generator 308 receives an external clock signal 401 from external clock 302 shown as "CLKTN" 401 (as shown in FIG. 4). In a step 504, input waveform stabilizer 02 stabilizes CLKIN 401. Waveform stabilizer 402 reshapes CLKIN 401 into a square wave (CLK 405) because CLK1N 401 tends to be distorted due to input jitter, noise from ground bounce and coupling. In the preferred embodiment, waveform stabilizer 402 is a Schmitt trigger. The structure and operation of a Schmitt trigger are well known to those skilled in the art.

A. Programming

In a step 508, CLK 405 is received by clock-to-clock non-overlapping time adjuster 406, and multiple signals with non-overlapping active phases 407 are generated with adjustable delay between edges. The clock generator 308 can be programmed to provide desired holding times between clock edges.

There are two types of programming that can occur: hardware and software. Hardware programming normally occurs during the testing stages of a chip and involves altering the chip physically. This process is typically irreversible. Software programming normally occurs while a chip is functioning in an operational environment. Software programming is dynamic, allowing adjustments to delay time T between clock edges without physically altering the chip. Programming capability in both cases is accomplished by adding or subtracting delay elements in feedback paths within the clock generator circuit (to be described).

1. Hardware Programming

Figure 6A:
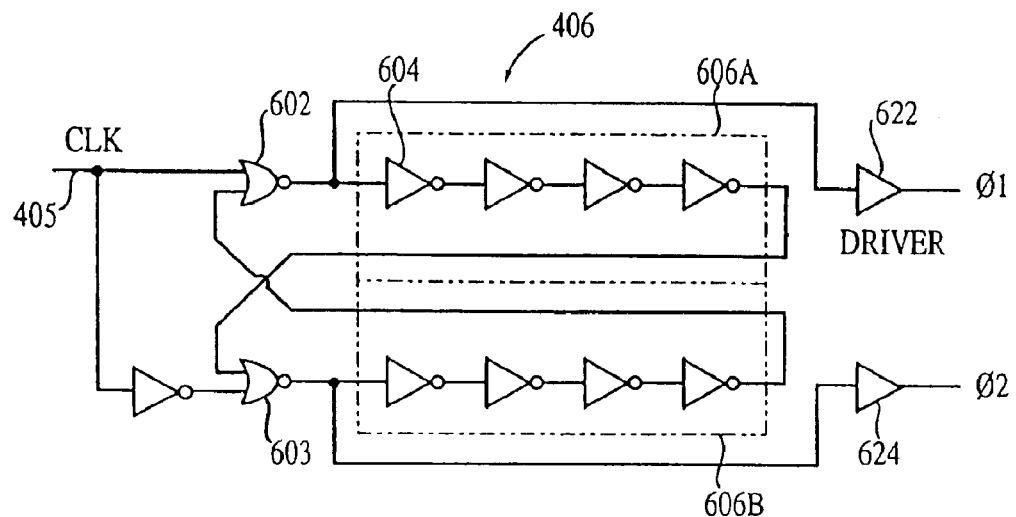
FIG. 6A illustrates a circuit diagram of a clock-to-clock non-overlapping time adjuster according to a hardware embodiment of the present invention.

FIG. 6A illustrates the hardware embodiment of a clock to clock non-overlapping time adjuster 406 according to the present invention. Referring to FIG. 6A, clock-to-clock non-overlapping time adjuster 406 includes logic gates 602, 603, delay element(s) 604 and drivers 622, 624.

In the preferred embodiment, logic gates 602 and 603 are NOR gates and delay elements 604 are inverters. Other logic elements can be substituted for the ones described in the preferred embodiment. For instance, inverter 604 can be replaced with NAND gates having inputs tied together. Additionally, delay elements 604 can be any device (i.e., resistors) that delay a signal.

Delay elements 604, form delay paths 606A, 606B (generally 606) which govern the amount of delay between clock signal φ1 and clock signal φ2. Adjusting the length of delay paths 606 by adding or subtracting delay elements 604 coupled to logic gates 602, 603, increases or decreases the amount of time T between edges of clock signals φ1 and φ2. Typically, a chip designer will include more delay elements 604 than needed to afford latitude in the selection of possible delay times. Selection from a plurality of pre-planned delay paths 606 provide a corresponding plurality of non-overlapping optional times between clock edges.

Figure 6B:
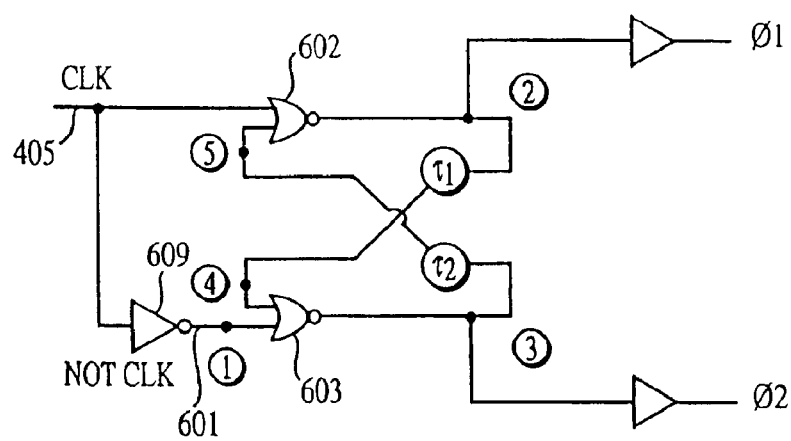
FIG. 6B illustrates a logic circuit diagram of a clock-to-clock non-overlapping time adjuster with generic delay paths.

FIG. 6B illustrates clock-to-clock non-overlapping time adjuster 406 with generic delay paths or delay segments τ1 and τ2 to delay clock signals φ1 and φ2. Delay segments τ1 and τ2 are equivalent to delay paths 606 shown in FIG. 6A. Changing the amount of delay allows the amount of time between edges of φ1 and φ2 to be adjusted. The amount of delay introduced in these segments τ1 and τ2 is programmable by adding or deleting delay elements 604.

Referring to FIG. 6B, time adjuster 406 operates as follows. An input clock signal (CLK) 405 passes through inverter 609 to form inverted clock signal 601 (NOTCLK 601). CLK 405 and NOTCLK 601 are used to form two new clock signals φ1 and φ2. CLK 405 is an input signal to NOR gate 602 along with a delayed signal φ2. NOTCLK 601 is an input signal to NOR gate 603 along with delayed φ1 signal.

Figure 6C:
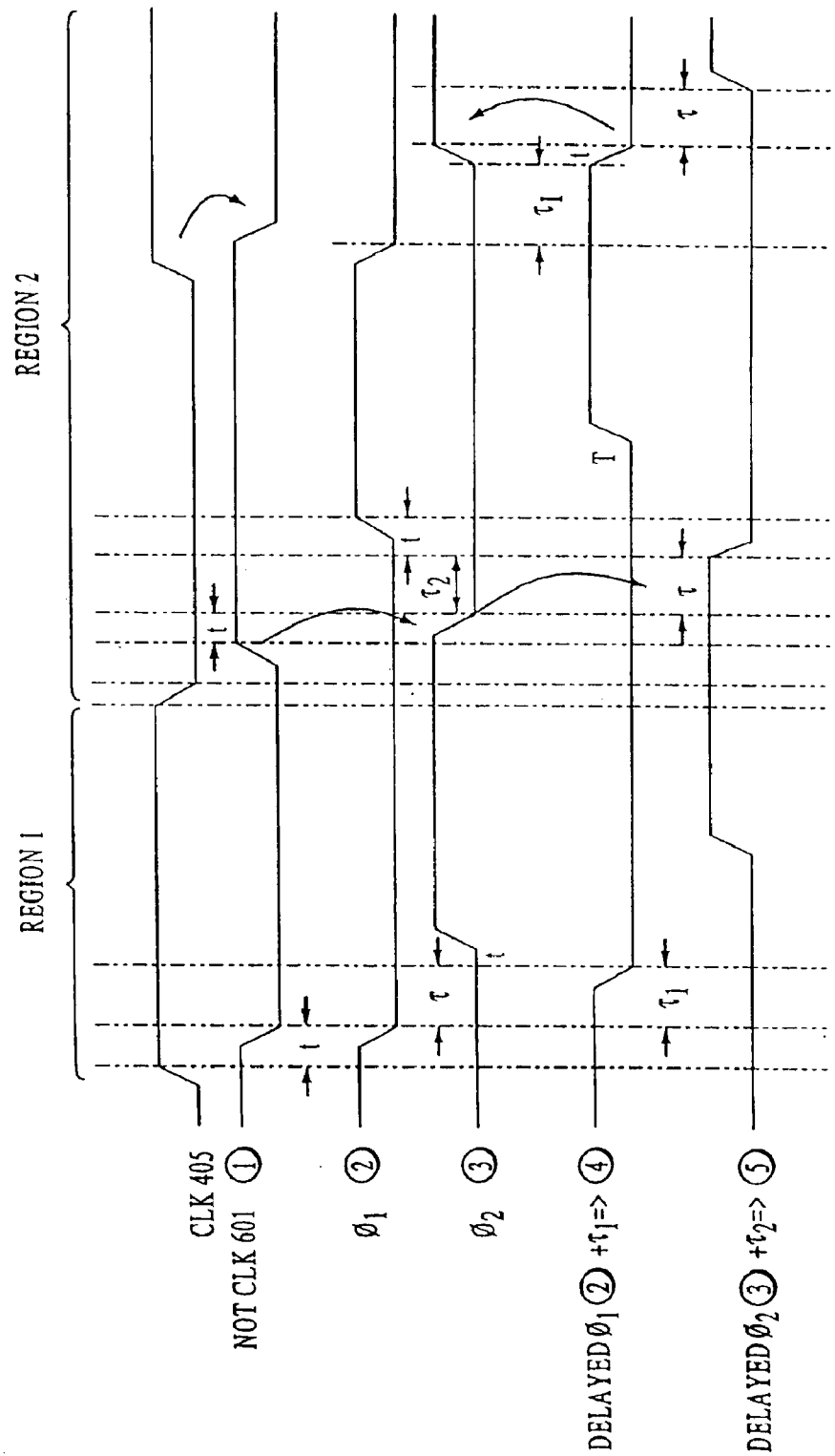
FIG. 6C illustrates a timing diagram of the operation of the clock-to-clock non-overlapping time adjuster.

FIG. 6C is a timing diagram illustrating the operation of the clock to clock non-overlapping time adjuster 406 of the present invention. Referring to FIGS. 6B and 6C, the technique of the clock to clock non-overlapping time adjuster 406 will now be described. Note, gate delays, which are shown as t in FIG. 6C, are negligible. Note: t=gate delay; τ=delay of a delay element; and T=t+τ.

As shown in FIG. 6C, in the beginning of region 1, clock 405 transitions to a logic high state, which forces 951 to the logic low state. A delay timer τ1 later, delayed φ1 transitions to a low state. Since NOTCLK 601 is at a logic low state, this transition forces φ2 to transition to a logic high state.

As a result of delay τ1, the rising transition of φ2 lags behind the falling transition of 451 by the amount of τ1 plus any gate delay times t. The amount of time separating the falling transitions of φ1 from the rising transitions of φ2 is controlled by adjusting τ1. If the circuit designer wishes to increase the clock frequency, τ1 is programmed to a lesser amount. On the other hand, if the circuit operation is hampered by overlapping falling and rising transitions of φ1 and φ2, respectively, τ1 is increased until this problem is rectified. In this manner, the circuit is optimized by increasing the clock frequency to the maximum permissible level without the transitions overlapping.

In a similar fashion, the falling edges of φ2 are separated from the rising edges of φ1 by controlling the amount of delay programmed into τ2. If the delay in τ2 is increased, the separation between the falling edges of φ2 and the rising edges of τ1 is increased, and if the delay in τ2 is decreased, the separation is decreased. Therefore, the circuit can be further optimized by adjusting the time T between the falling edges of φ2 and the rising edges of φ1.

Figure 7:
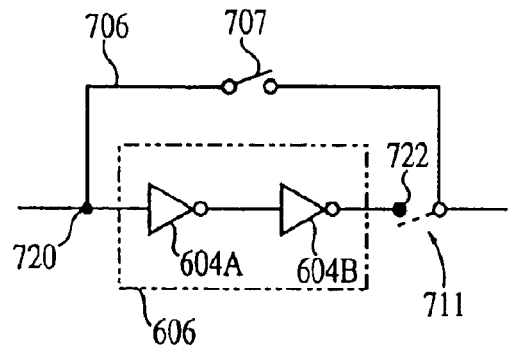
FIG. 7 illustrates an example of hardware programming according to the present invention.

An example of hardware programming is illustrated in FIG. 7. FIG. 7 represents a portion of delay path 606 of FIG. 6A. Programming is accomplished by closing or opening switches 707, 711. When switch 707 is closed, nodes 720 and 722 are shorted together. Additionally, by opening switch 711 delay elements 604A, 604B are completely dropped out of the circuit or "shorted out." Thus, closing switch 707 and opening switch 711, bypasses delay elements 604A, 604B and decreases the amount of path delay for a signal. Opening switch 707 and closing switch 711 increases the amount of path delay for a signal that passes through delay path 606.

There are a number of ways to close or open switches 707, 711. Such techniques include fuse/anti-fuse processing, laser burning, ion beam milling and other techniques. In the preferred embodiment laser "zap" burning technique is used to open/close switches 707, 711.

2. Software Programming

Figure 8A:
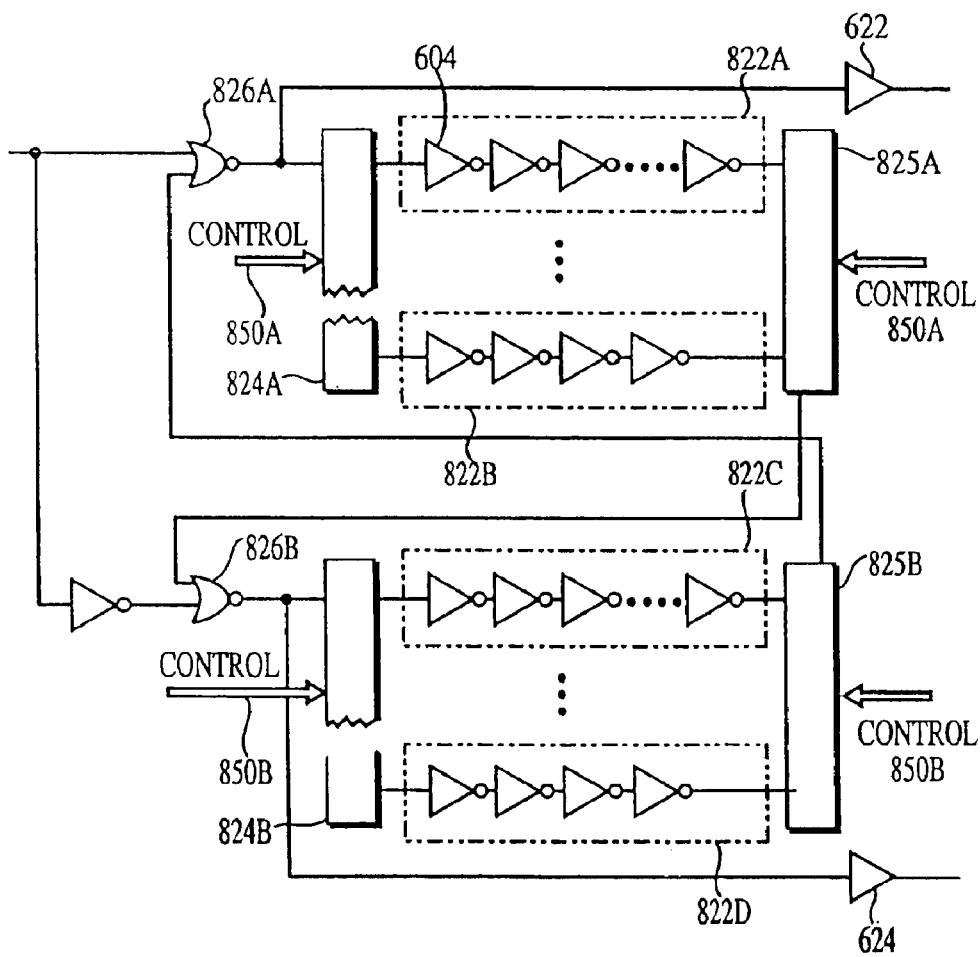
FIG. 8A illustrates a circuit diagram of a clock-to-clock non-overlapping time adjuster according to a software embodiment of the present invention utilizing path selection to adjust delay.
Figure 8B:
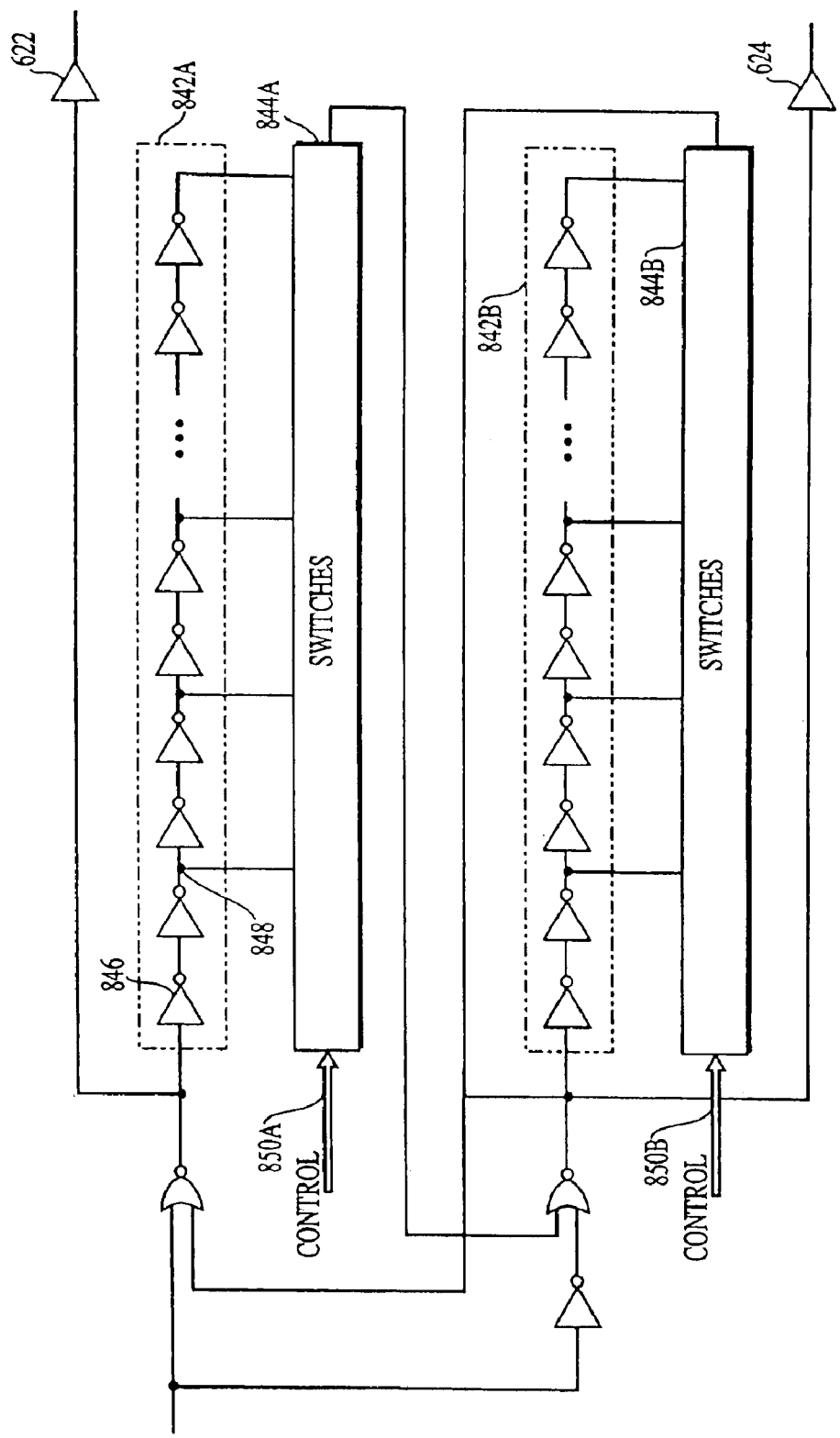
FIG. 8B illustrates a circuit diagram of a clock-to-clock non-overlapping time adjuster according to a software embodiment of the present invention utilizing path length selection to adjust delay.

FIGS. 8A and 8B are logic level circuit diagrams of a clock-to-clock non-overlapping time adjuster 406 according to a software embodiment of the present invention. FIGS. 8A and 8B are similar to FIG. 6 with the exception of the manner in which the delay elements τ are implemented. In other words, the software embodiment operates in a manner similar to that of the hardware embodiment described above. However, in the software embodiment, the delay times τ1 and τ2 are not fixed at the time of fabrication as they are in the hardware embodiment. In the software embodiment, the amount of delay chosen for τ1 and τ2 is selected using software, and can be changed as required to compensate for changes in operating conditions or other operational parameters.

FIG. 8A illustrates a software embodiment using path selection to adjust delay times τ1 and τ2. Referring to FIG. 8A, multiple paths (generally 822) are established on the chip, each having different propagation delay times. The paths 822 are duplicated for τ1 and τ2. Delay paths 822 can be implemented using a multiplicity of delay elements. FIG. 8A shows delay paths 822 made up of inverters 604. If inverters are chosen, an even number must be used in each path 822 for proper operation.

The manner of path selection will now be described. Control words 850A, 850B are generated and sent to demultiplexers 824A, 824B selecting the paths to be followed.

Control words 850A, 850B are also sent to multiplexers 825A, 825B for selecting paths to be followed. Control words 850A, 850B command demultiplexers 824A, 824B and multiplexers 825A, 825B to route the signals output from NOR-gates 826A, 826B, respectively, through a specified path 822. The amount of delay, therefore, varies depending on the propagation delay of the selected path 822.

FIG. 8B illustrates a software embodiment using path-length selection to adjust delay times τ1 and τ2. In this embodiment paths 842A, 842B are made up of strings of delay elements 846 and multiple connection points 848. Control words 850 are sent to switches 844A, 844B. The control words 850A, 850B 'command' switch 844A, 844B, respectively to select the signal at one of connection points 848 along the string. The farther along the string connection point 848 is chosen, the longer the delay time will be. Switches 844A, 844B are multiplexers.

Strings 842A, 842B are shown in FIG. 8B as being implemented using inverters as the delay elements 846. If inverters are used, the paths must be chosen such that only an even number of inverters can be selected to make up the delay of the signal. A number of other elements 846 can also be chosen to make up delay paths 842A, 842B.

B. Combination Embodiment.

The present invention can be implemented using a combination of the hardware and software embodiments described above. For example, the delay strings can be first adjusted to a maximum delay time as described in the hardware embodiment. Then, fine tuning can be accomplished in the operational environment using the software embodiments described above.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for manufacturing a clock generator that generates two non-overlapping clock signals, comprising:

providing an apparatus that includes a clock input portion, first and second clock outputs, a first feedback path for coupling said first clock output to said clock input portion, and a second feedback path for coupling said second clock output to said clock input portion;

determining if first and second clock signals generated by said first and second clock outputs, respectively, have clock edges that are non-overlapping for a predetermined time T;

adding one or more delay elements in series along said first and/or second feedback paths during manufacturing if said first and second clock signals do not have clock edges that are non-overlapping for said predetermined time T.

2. The manufacturing method of claim 1, wherein adding a delay element to one of said first or second feedback paths comprises opening a first switch and closing a second switch along said first or second feedback path.

3. The manufacturing method of claim 2, wherein said opening of said first switch and said closing of said second switch comprises performing fuse/anti-fuse processing.

4. The manufacturing method of claim 2, wherein said opening of said first switch and said closing of said second switch comprises performing laser burning.

5. The manufacturing method of claim 2, wherein said opening of said first switch and said closing of said second switch comprises performing ion beam milling.

6. A method for manufacturing a clock generator that generates two non-overlapping clock signals, comprising:

providing an apparatus that includes a clock input portion, first and second clock outputs, a first feedback path for coupling said first clock output to said clock input portion, and a second feedback path for coupling said second clock output to said clock input portion;

determining if first and second clock signals generated by said first and second clock outputs, respectively, have clock edges that are non-overlapping for a predetermined time T; and removing one or more delay elements in series along said first and/or second feedback paths during manufacturing if said first and second clock signals do not have clock edges that are non-overlapping for said predetermined time T.

7. The manufacturing method of claim 6, wherein removing a delay element from one of said first or second feedback paths comprises closing a first switch and opening a second switch along said first or second feedback path.

8. The manufacturing method of claim 7, wherein said closing of said first switch and said opening of said second switch comprises performing fuse/anti-fuse processing.

9. The manufacturing method of claim 7, wherein said closing of said first switch and said opening of said second switch comprises performing laser burning.

10. The manufacturing method of claim 7, wherein said closing of said first switch and said opening of said second switch comprises performing ion beam milling.

* * * * *